United States Patent
Kirikihira

(10) Patent No.: US 10,462,899 B2
(45) Date of Patent: Oct. 29, 2019

(54) CERAMIC SUBSTRATE AND ELECTRONIC DEVICE

(71) Applicant: KYOCERA Corporation, Kyoto-shi, Kyoto (JP)

(72) Inventor: Isamu Kirikihira, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/882,063

(22) Filed: Jan. 29, 2018

(65) Prior Publication Data

US 2018/0310402 A1    Oct. 25, 2018

(30) Foreign Application Priority Data

Apr. 24, 2017    (JP) .................... 2017-085516

(51) Int. Cl.
| | |
|---|---|
| C04B 35/587 | (2006.01) |
| H05K 1/03 | (2006.01) |
| C04B 35/14 | (2006.01) |
| H01L 23/15 | (2006.01) |
| C04B 35/584 | (2006.01) |
| H01L 23/373 | (2006.01) |

(52) U.S. Cl.
CPC .......... *H05K 1/0306* (2013.01); *C04B 35/14* (2013.01); *C04B 35/584* (2013.01); *H01L 23/15* (2013.01); *H01L 23/3731* (2013.01); *C04B 2235/3206* (2013.01); *C04B 2235/3224* (2013.01); *C04B 2235/85* (2013.01); *C04B 2237/32* (2013.01); *H01L 2224/48091* (2013.01); *H01L 2224/48247* (2013.01); *H01L 2924/181* (2013.01)

(58) Field of Classification Search
CPC ... C04B 35/584; C04B 35/587; C04B 35/591; C04B 35/593
See application file for complete search history.

(56) References Cited

U.S. PATENT DOCUMENTS

| | | |
|---|---|---|
| 6,242,374 B1 | 6/2001 | Komatsu |
| 2009/0194519 A1 | 8/2009 | Funaki et al. |

FOREIGN PATENT DOCUMENTS

| | | | |
|---|---|---|---|
| EP | 0963966 A1 | | 12/1999 |
| EP | 2546216 A1 | | 1/2013 |
| EP | 2014051088 | * | 4/2014 |
| JP | 60-145965 A | | 8/1985 |
| JP | 2007-335397 A | | 12/2007 |
| KR | 19990088209 A | | 12/1999 |
| WO | 2011/111746 A1 | | 9/2011 |

* cited by examiner

*Primary Examiner* — Karl E Group
(74) *Attorney, Agent, or Firm* — Volpe and Koenig, P.C.

(57) ABSTRACT

There is provided a ceramic substrate including: a silicon nitride crystal phase containing a plurality of silicon nitride crystals, and grain boundaries between the silicon nitride crystals; and a silicate phase containing magnesium silicate crystals and rare earth silicate crystals, respective maximum particle sizes of the magnesium silicate crystals and the rare earth silicate crystals being smaller than that of the silicon nitride crystals, the silicate phase being positioned in the grain boundaries.

6 Claims, 4 Drawing Sheets

CERAMIC SUBSTRATE AND ELECTRONIC DEVICE

BACKGROUND OF THE INVENTION

1. Field of the Invention

The present invention relates to a ceramic substrate containing a ceramic material, and an electronic device.

2. Description of the Related Art

As an insulating substrate on which electronic components such as a power semiconductor device are mounted, a ceramic substrate formed of a silicon nitride sintered body is used. The silicon nitride sintered body has a relatively large mechanical strength and thermal conductivity and hence is used as the insulating substrate. In the silicon nitride sintered body, an oxide of calcium, magnesium, aluminum, yttrium, or the like is used as a sintering aid (see, for example, Patent Literatures 1 and 2).

The electronic components mounted on the insulating substrate are thermally connected to a heat dissipator formed of a metal through the insulating substrate and the like so as to dissipate heat from the electronic components through the heat dissipator to the outside. Further, the electronic components are electrically connected to an external electric circuit through a conductive connecting material such as a lead terminal.

CITATION LIST

Patent Literature

Patent Literature 1: JP-A 60-145965
Patent Literature 2: JP-A 2007-335397

SUMMARY OF THE INVENTION

A ceramic substrate according to one aspect of the invention comprises a silicon nitride crystal phase containing a plurality of silicon nitride crystals, and grain boundaries between the silicon nitride crystals, and a silicate phase containing magnesium silicate crystals and rare earth silicate crystals, respective maximum particle sizes of the magnesium silicate crystals and the rare earth silicate crystals being smaller than that of the silicon nitride crystals, the silicate phase being positioned in the grain boundaries.

An electronic device according to one aspect of the invention comprises the ceramic substrate having the above-mentioned configuration, and an electronic component thermally connected to the ceramic substrate.

DETAILED DESCRIPTION

A ceramic substrate and an electronic device according to an embodiment of the invention will be described with reference to the accompanying drawings. In the following description, an upper portion and a lower portion are distinguished, and such description is made for convenience's sake, and does not limit the position of the ceramic substrate or electronic device being actually used. Further, in the following description, values of thermal conductivity are those which are measured at room temperature to about 500° C. Furthermore, the thermal conductivity shown in the following description can be measured by means of various types of measuring apparatuses in accordance with a non-steady method.

Figure 1:
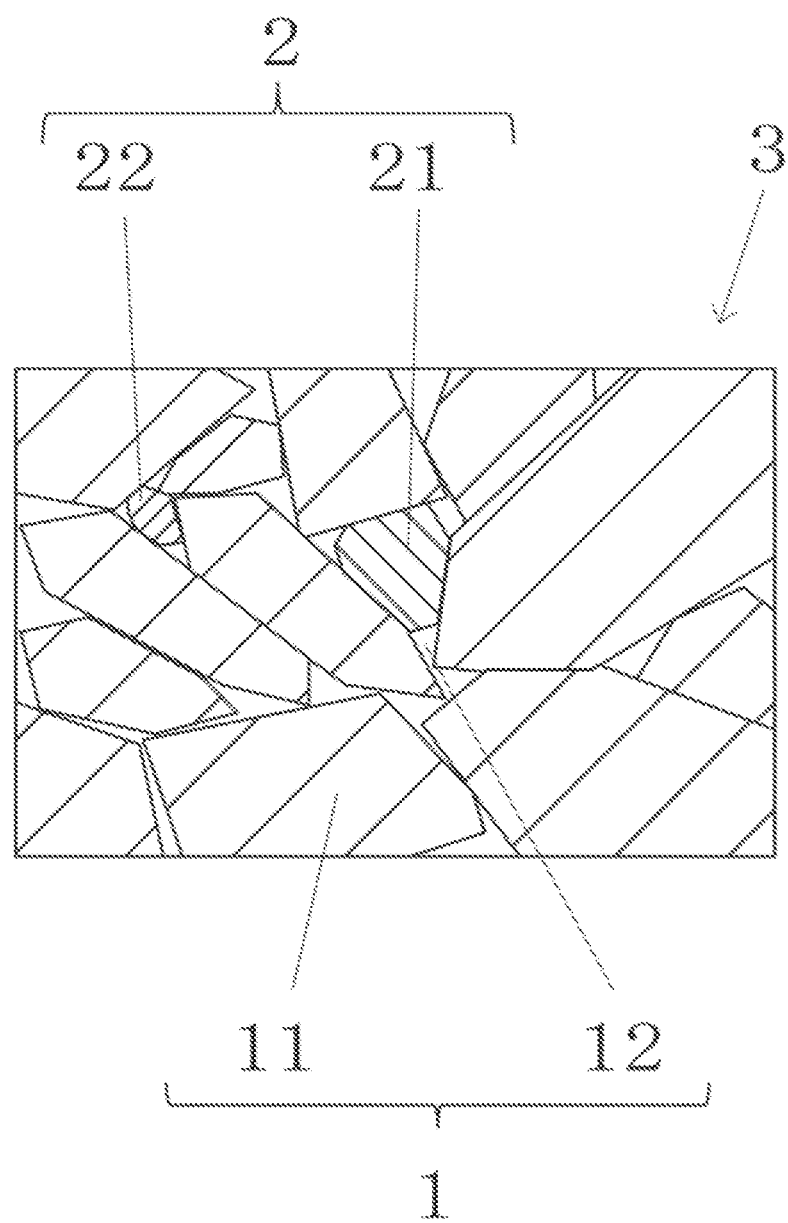
FIG. 1 is an enlarged cross-sectional view showing a principal part of an example of a ceramic substrate according to an embodiment of the invention.
Figure 2:
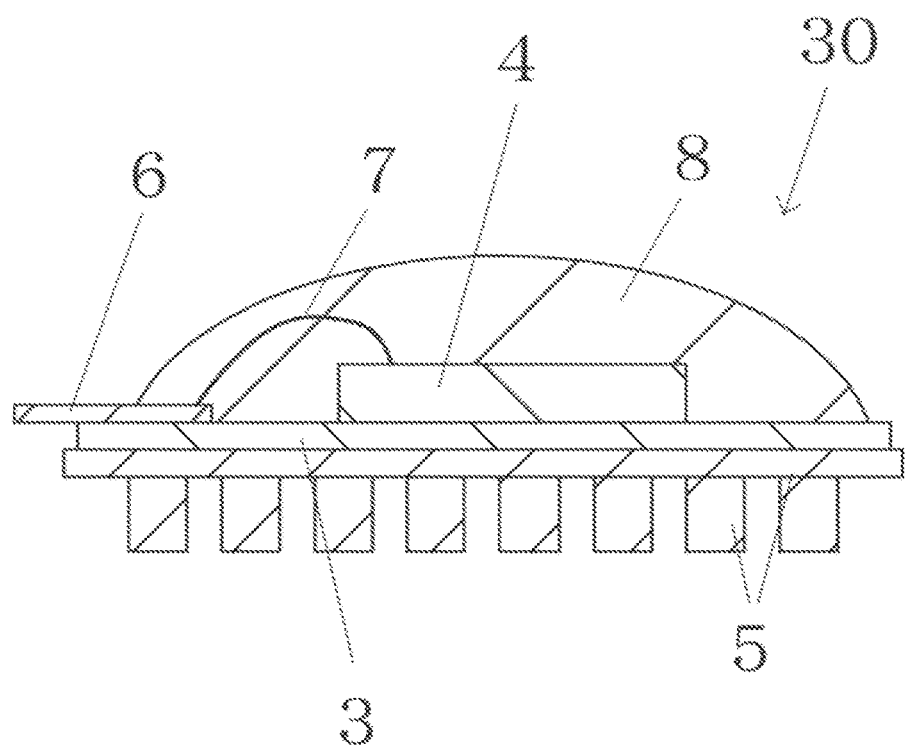
FIG. 2 is a cross-sectional view showing an example of the electronic device according to an embodiment of the invention.

FIG. 1 is an enlarged cross-sectional view showing a principal part of an example of the ceramic substrate according to an embodiment of the invention. FIG. 2 is a cross-sectional view showing the ceramic substrate having the principal part shown in FIG. 1 and the whole of an electronic device having the ceramic substrate. A ceramic substrate 3 basically comprises a silicon nitride crystal phase 1 and a silicate phase 2 present in the silicon nitride crystal phase 1. An electronic device 30 basically comprises the ceramic substrate 3 and an electronic component 4 which are thermally connected to each other. The electronic device 30 shown in FIG. 2 is an example of the electronic device according to an embodiment of the invention.

A state where the ceramic substrate 3 and the electronic component 4 are thermally connected to each other means a state where the thermal conductivity between them is about 65 W/(m·K) or more. A state where the ceramic substrate 3 and the electronic component 4 are directly in contact with each other is included in the state where the ceramic substrate 3 and the electronic component 4 are thermally connected to each other. Details of the configuration inside of the ceramic substrate 3 and mounting and thermal connection of the electronic component 4 onto the ceramic substrate 3 will be described later.

The ceramic substrate 3 is, for example, in a flat plate form having a rectangular upper surface and lower surface. The upper surface of the ceramic substrate 3 corresponds to a portion on which the electronic component 4 is mounted. The electronic component 4 is mounted on the middle portion or the like of the upper surface. The lower surface of the ceramic substrate 3 corresponds to a portion connected to a heat dissipator 5. The lower surface of the ceramic substrate 3 is connected to the heat dissipator 5 so as to be opposed to the heat dissipator. Thus, a heat transfer path in which heat is dissipated from the electronic component 4 through the ceramic substrate 3 and heat dissipator 5 is provided.

Examples of the electronic components 4 include various types of electronic devices, e.g., semiconductor integrated circuit devices; power semiconductor devices; opto-semiconductor devices such as a light-emitting diode (LED) or a charge coupled device (CCD); sensor devices such as a current sensor device or a magnetic sensor device; and micro-machines having a micro-electro-mechanical system disposed on a surface of a semiconductor substrate (so-called MEMS devices). The electronic component 4 may include a plurality of types of components, and may include a so-called passive device such as a piezoelectric device, a capacitive device or a resistor.

The electronic component 4 is mounted on and connected to the ceramic substrate 3 using a bonding material, e.g., a low-melting point brazing material such as a gold-tin brazing material, a bonding material containing an organic resin (adhesive), or a bonding material containing glass. For example, the lower surface of the electronic component 4 is placed on the upper surface of the ceramic substrate 3 at a predetermined position (mounting portion) through a bonding material (not shown). Then, the bonding material is heated to a predetermined temperature using a heating apparatus such as an electric furnace. The electronic component 4 can be connected to the upper surface of the ceramic substrate 3 through the above steps.

The electronic component 4 is mounted on the ceramic substrate 3 so that the ceramic substrate 3 and the electronic component 4 are thermally connected to each other as mentioned above. For achieving such connection, for example, a bonding material having a thermal conductivity of about 65 W/(m·K) or more, such as a gold-tin brazing material, may be used. In this case, the thickness of the bonding material is set to, for example, about 100 μm. Further, for example, when a resin adhesive (having a thermal conductivity of about 20 to 23 W/(m·K)) is used as a bonding material, the thickness of the bonding material may be set to about 30 μm or less.

As mentioned above, the ceramic substrate 3 functions as a base for mounting thereon and fixing thereto the electronic component 4. The electronic component 4 fixed to the ceramic substrate 3 is electrically connected to, for example, a lead terminal 6, and electrically connected to an external electric circuit (not shown) through the lead terminal 6.

Figure 3:
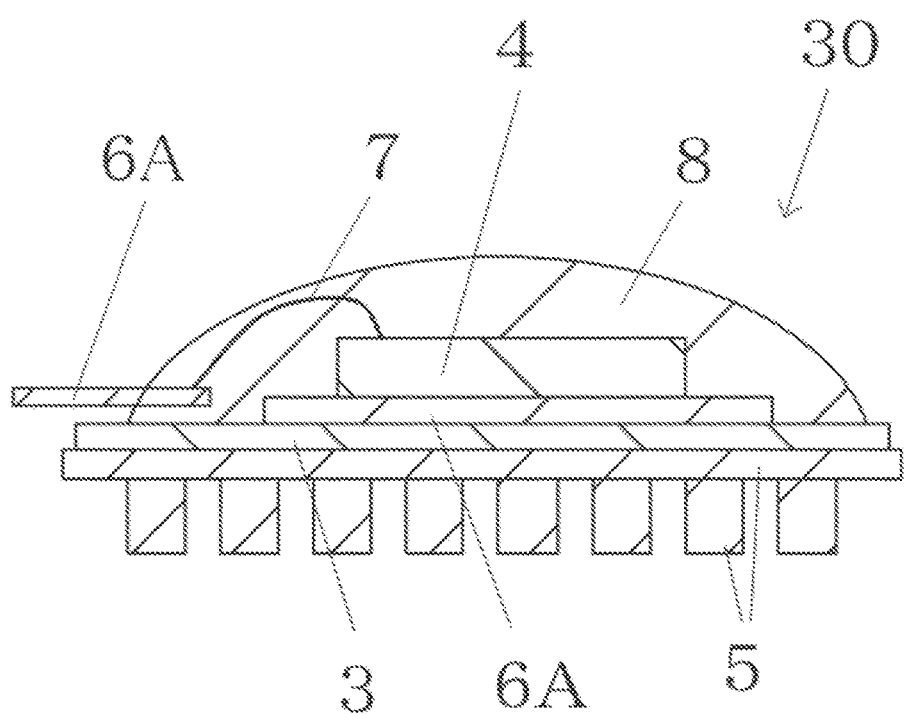
FIG. 3 is a cross-sectional view showing a modified example of FIG. 1.

The lead terminal 6 is formed of a metal material such as an iron-nickel alloy, an iron-nickel-cobalt alloy, copper or a copper alloy. The lead terminal 6 formed of a metal material is, for example, a member in a rectangular form which is thin and long (or in a strip form), and is disposed on the ceramic substrate 3 so as to extend outwardly from a portion close to the ceramic substrate 3. In this case, according to the number of electrodes of the electronic component 4, a plurality of lead terminals 6 may be arranged side by side in a width direction of the ceramic substrate 3. Alternatively, for example, as shown in FIG. 3, a lead frame 6A in which a plurality of lead terminals 6 are connected and integrated together with a frame-shaped metal member (frame), may be used as the lead terminal 6. FIG. 3 is a cross-sectional view showing a modified example of FIG. 2. In FIG. 3, the same parts or portions as those shown in FIG. 2 are denoted by the same reference numerals. In this case, the lead frame 6A may have a flat-shaped plate portion positioned in the middle of the upper surface of the ceramic substrate 3. The electronic component 4 may be mounted on a part of the flat-shaped plate portion of the lead frame 6A. In the lead frame 6A, the flat-shaped plate portion and a strip-shaped portion to be connected to the outside are connected to each other by, for example, a hanging lead (not shown). The lead frame 6A in this case functions also as a heat transfer member which constitutes part of the heat transfer path extending from the electronic component 4 to the heat dissipator 5.

The electronic component 4 is electrically connected to the lead terminal 6 through a conductive connecting material such as a bonding wire 7. The electronic component 4 and the lead terminal 6 are electrically connected to each other through the bonding wire 7, and in this state, the electronic component 4 and the upper surface of the ceramic substrate 3 as well as the bonding wire 7 are covered with a molding resin 8, so that the electronic component 4 is encapsulated, thereby forming an electronic device 30 in which the ceramic substrate 3 and the electronic component 4 are thermally connected to each other, and it is easy to dissipate heat from the electronic component 4 and to electrically connect the electronic component 4 to the outside.

The molding resin 8 is formed of, for example, a material containing a resin material such as an epoxy resin or a silicone resin. The molding resin 8 may contain filler particles formed of an inorganic material such as silica particles, in a resin material such as an epoxy resin. The filler particles are added to control properties of the molding resin 8 such as a thermal expansion coefficient (reduction of a difference in thermal expansion coefficient between the molding resin 8 and the ceramic substrate 3), a mechanical strength, or permeability to moisture in open air.

The ceramic substrate 3 functions also as part of a heat transfer path which promotes dissipation of heat from the electronic component 4 mounted on the ceramic substrate 3 as mentioned above. In this case, the ceramic substrate 3 constitutes part of the heat transfer path for thermally connecting the mounted electronic component 4 to a metallic heat dissipator 5 such as a heat dissipating fin. For achieving this, the ceramic substrate 3 having a higher thermal conductivity is preferred. Further, the ceramic substrate 3 having a smaller thickness (or being thinner) is preferred. From the viewpoint of ensuring a mechanical strength of the electronic device 30 having the ceramic substrate 3 when the thickness of the ceramic substrate 3 is reduced, the ceramic substrate 3 is preferably formed of a material having a higher mechanical strength. The ceramic substrate 3 of the embodiment has, as mentioned above, an advantageous configuration for improving such thermal conductivity and mechanical strength.

That is, the ceramic substrate 3 of the embodiment comprises the silicon nitride crystal phase 1 containing a plurality of silicon nitride crystals 11, and grain boundaries 12 between the silicon nitride crystals 11. Further, the ceramic substrate 3 comprises the silicate phase 2 positioned in the grain boundaries 12. The silicate phase 2 contains magnesium silicate crystals 21 and rare earth silicate crystals 22, wherein respective maximum particle sizes of the magnesium silicate crystals 21 and the rare earth silicate crystals 22 are smaller than that of the silicon nitride crystals 11. That is, the maximum particle size of the magnesium silicate crystals 21 is smaller than the maximum particle size of the silicon nitride crystals 11. The maximum particle size of the rare earth silicate crystals 22 is also smaller than the maximum particle size of the silicon nitride crystals 11. Further, as mentioned above, the electronic device 30 of the embodiment comprises the ceramic substrate 3 having the above-mentioned configuration, and an electronic component 4 thermally connected to the ceramic substrate 3.

According to the ceramic substrate 3 of the embodiment, by virtue of having the above-mentioned configuration, thermal conduction is effectively made between the silicon nitride crystals 11 adjacent to each other through the silicate phase 2 present in the grain boundaries 12 between the silicon nitride crystals 11. Further, the sintering properties between the silicon nitride crystals 11 are enhanced. Therefore, it is possible to provide the ceramic substrate 3 having improved thermal conductivity and mechanical strength. Further, the electronic device 30 of the embodiment comprises the ceramic substrate 3 having the above-mentioned configuration, and therefore it is possible to provide the electronic device 30 in which dissipation of heat to the outside is easily improved.

In this case, both of the magnesium silicate crystals 21 and the rare earth silicate crystals 22 are smaller in particle size as compared to the silicon nitride crystals 11. Therefore, the silicate phase 2 can be easily positioned in the grain boundaries 12 which are present between the silicon nitride crystals 11 and are relatively narrow. The maximum particle size of the silicon nitride crystals 11 is, for example, about 3 to 4 μm. The maximum particle size of the magnesium silicate crystals 21 and the rare earth silicate crystals 22 is, for example, about 0.8 to 1 μm.

For example, the ceramic substrate 3 of the embodiment has a thermal conductivity of about 70 W/(m·K) or more. Further, a mechanical strength of the ceramic substrate 3 of the embodiment is, for example, a bending strength which is about 700 MPa or more as measured in accordance with a three-point bending test. Therefore, a thermal resistance in the ceramic substrate 3 which constitutes part of the heat transfer path extending from the electronic component 4 to the heat dissipator 5 can be effectively reduced. Thus, it is possible to provide the ceramic substrate 3 which is easy to produce an electronic device 30 having high heat dissipation properties. Further, it is possible to provide the electronic device 30 having high heat dissipation properties.

The silicon nitride crystal phase 1 in the ceramic substrate 3 is a framework portion of the ceramic substrate 3, and has a function of maintaining the ceramic substrate 3 in a certain shape and size. In other words, the silicon nitride crystal phase 1 is a main component of the ceramic substrate 3, and the ceramic substrate 3 is basically formed of a silicon nitride sintered body.

The plurality of silicon nitride crystals 11 in the silicon nitride crystal phase 1 are portions which basically constitute the silicon nitride crystal phase 1. That is, the silicon nitride crystals 11 which are adjacent to each other are sintered together to ensure a certain mechanical strength of the ceramic substrate 3. Further, heat is successively transferred between the adjacent silicon nitride crystals 11, achieving basic thermal conduction in the ceramic substrate 3.

The grain boundaries 12 in the silicon nitride crystal phase 1 are interposed between the adjacent silicon nitride crystals 11 to facilitate arrangement of the silicon nitride crystals 11 in the silicon nitride sintered body which is a polycrystalline body. The silicon nitride crystals 11 having different shapes and sizes have the grain boundaries 12 disposed between the silicon nitride crystals to form the polycrystalline body.

The content of the silicon nitride crystals 11 in the ceramic substrate 3 is, for example, about 80 to 97% by mass. When the content of the silicon nitride crystals 11 in the ceramic substrate 3 is about 80% by mass or more, the ceramic substrate 3 easily secures a thermal conductivity and a mechanical strength. Further, when the content of the silicon nitride crystals 11 in the ceramic substrate 3 is 97% by mass or less, the silicate phase 2 as a sintering aid is easily and effectively dispersed, advantageously improving the sintering properties.

The silicate phase 2 in the ceramic substrate 3 has a function of enhancing the thermal conductivity and mechanical strength of the ceramic substrate 3. That is, when the silicate phase 2 is positioned in the grain boundaries 12, opposed silicon nitride crystals having the grain boundary 12 disposed therebetween of the adjacent silicon nitride crystals 11 are effectively, thermally and mechanically connected to each other through the silicate phase 2.

Examples of components constituting the silicate phase 2 include magnesium silicate, manganese silicate, molybdenum silicate, and silicates of a rare earth such as erbium or yttrium. In the example shown in FIG. 1, magnesium silicate crystals 21 and erbium silicate crystals 22 mainly constitute the silicate phase 2. The silicate phase 2 may contain a small amount of a component other than the silicate, for example, an oxide or the like.

In this case, the silicate phase 2 can be strongly bonded to the silicon nitride crystals 11 through the silicon (Si) component which is also contained in the silicon nitride crystals 11. Further, for example, magnesium silicate has a thermal conductivity of about 60 to 80 W/(m·K), and therefore the silicate phase 2 has a relatively large thermal conductivity. For example, in the case of the silicate phase 2 containing rare earth silicate crystals such as erbium silicate crystals, and magnesium silicate crystals as a main component, the thermal conductivity of the silicate phase 2 is about 60 W/(m·K) or more.

The content of the silicate phase 2 in the ceramic substrate 3 may be, for example, about 3 to 20% by mass. When the content of the silicate phase 2 in the ceramic substrate 3 is 3% by mass or more, the silicate phase 2 is effectively arranged in each of the grain boundaries 12 in the silicon nitride crystal phase 1. Therefore, the adjacent silicon nitride crystals 11 can be effectively, thermally and mechanically connected to each other through the silicate phase 2 even at a portion other than the interface at which the silicon nitride crystals are not directly sintered.

Further, when the content of the silicate phase 2 in the ceramic substrate 3 is 20% by mass or less, a possibility that the silicate phase 2 (magnesium silicate crystals 21 or erbium silicate crystals 22) forms crystals (not shown) independent of the silicon nitride crystals 11 in the ceramic substrate 3 is effectively reduced. When such silicate crystals are present in an independent form, the corresponding portion of the ceramic substrate has a smaller thermal conductivity as compared to the silicon nitride crystals 11. In contrast, when the ceramic substrate 3 has the above-mentioned composition, a possibility that a portion having a relatively small thermal conductivity is formed in the ceramic substrate 3 is effectively reduced. Therefore, when the content of the silicate phase 2 in the ceramic substrate 3 is, for example, about 3 to 20% by mass, the ceramic substrate 3 is advantageously improved in the mechanical strength and thermal conductivity.

The content of the magnesium silicate crystals 21 in the silicate phase 2 is, for example, about 20 to 90% by mass. The magnesium silicate crystals 21 have a thermal conductivity as relatively large as about 60 W/(m·K) or more. Therefore, when the content of the magnesium silicate crystals 21 in the silicate phase 2 is 20% by mass or more, such a silicate crystal content is effective in improving the thermal conductivity of the ceramic substrate 3 which is a silicon nitride sintered body. Further, when the content of the magnesium silicate crystals 21 in the silicate phase 2 is 90% by mass or less, in other words, when the content of the rare earth silicate crystals in the silicate phase 2 is more than 10% by mass, sintering properties of the silicon nitride sintered body (ceramic substrate 3) are improved. Thus, such a silicate crystal content is effective in improving the mechanical strength of the ceramic substrate 3. Therefore, when the content of the magnesium silicate crystals 21 in the silicate phase 2 is, for example, about 20 to 90% by mass, the ceramic substrate 3 is advantageously improved in the mechanical strength and thermal conductivity.

Figure 4:
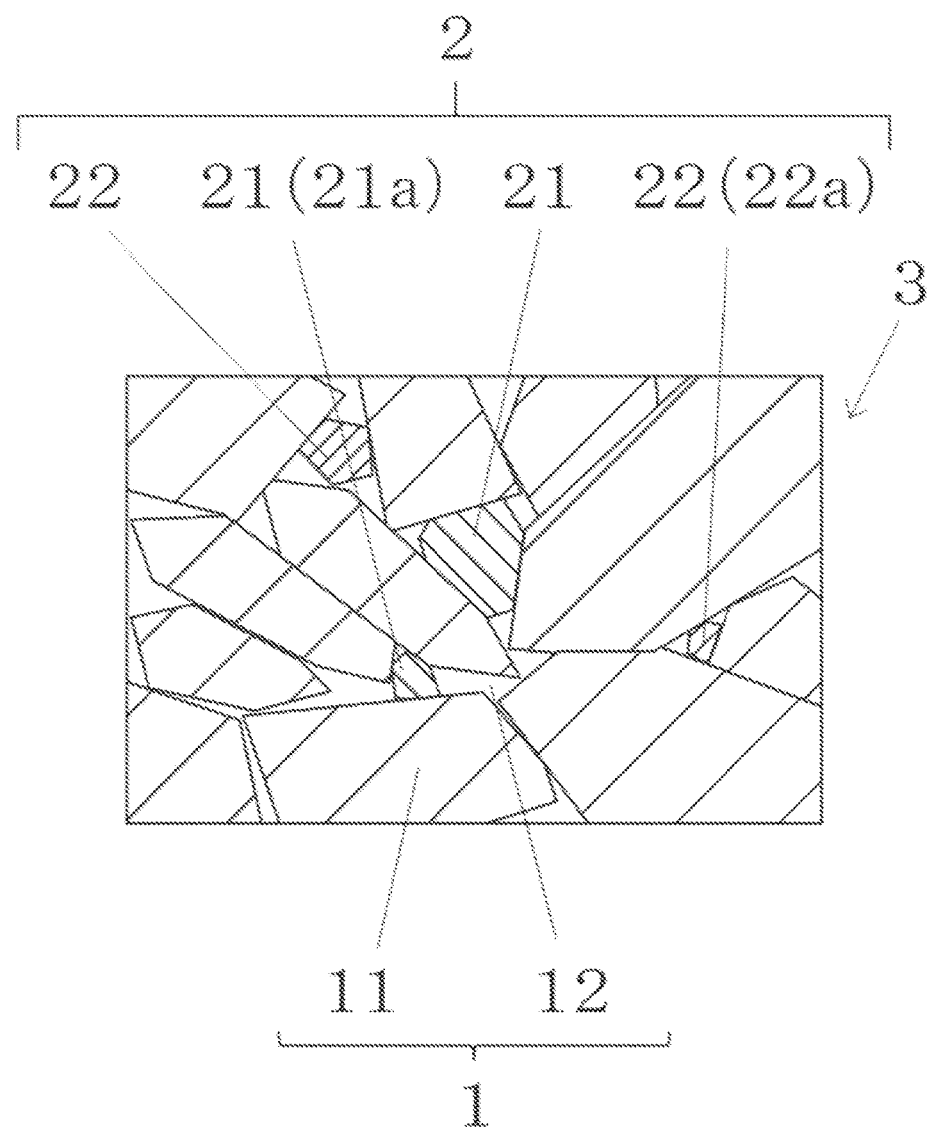
FIG. 4 is a cross-sectional view showing a modified example of FIG. 2.

In the ceramic substrate 3, the magnesium silicate crystals 21 and the rare earth silicate crystals 22 may be, for example, as seen in the examples shown in FIGS. 1 and 4, positioned in mutually different portions of the grain boundaries 12. FIG. 4 is a cross-sectional view showing a modified example of FIG. 1. In FIG. 4, the same parts or portions as those shown in FIG. 1 are denoted by the same reference numerals. Alternatively, the magnesium silicate crystals 21 and the rare earth silicate crystals 22 may be positioned in the same grain boundary 12. When the magnesium silicate crystals 21 and the rare earth silicate crystals 22 are positioned in mutually different portions of the grain boundaries 12, it is possible to advantageously obtain such an effect that the rare earth silicate crystals 22 improve the sintering properties between the silicon nitride crystals 11. Further, it is possible to advantageously obtain such an effect that the magnesium silicate crystals 21 ensure heat conduction between the silicon nitride crystals 11 at the grain boundaries 12.

FIG. 4 is a cross-sectional view showing a modified example of FIG. 1. In FIG. 4, the same parts or portions as those shown in FIG. 1 are denoted by the same reference numerals. As shown in FIGS. 1 and 4, the rare earth silicate crystals 22 may contain at least one of erbium silicate crystals and yttrium silicate crystals, respective minimum particle sizes of which are smaller than that of the magnesium silicate crystals. When the minimum particle size of the rare earth silicate crystals 22 is smaller than the minimum particle size of the magnesium silicate crystals 21, the rare earth silicate crystals 22 can be effectively positioned in the grain boundaries 12 between the silicon nitride crystals 11. In other words, the rare earth silicate crystals 22 are positioned in the narrow grain boundaries 12, making it possible to effectively enhance the sintering properties between the adjacent silicon nitride crystals 11. Thus, the mechanical strength of the ceramic substrate 3 can be effectively enhanced.

In the example shown in FIG. 4, the rare earth silicate crystals 22 contain those having a particle size larger than that of the magnesium silicate crystals 21. Also in this case, when the particle size of rare earth silicate crystals 22a having the minimum particle size is smaller than that of magnesium silicate crystals 21a having the minimum particle size, the above-mentioned improvement effect for the sintering properties can be obtained.

The particle size of the magnesium silicate crystals 21 and rare earth silicate crystals 22 can be measured by observing a cross-section of the ceramic substrate 3 using an electron microscope. The minimum particle size of these crystals is a minimum value of the particle sizes measured as mentioned above. The minimum particle size may be determined by observing a plurality of cross-sections of the ceramic substrate.

The silicon nitride crystals 11 have, for example, a particle size of about 0.5 to 4 μm and an average particle size of about 2.4 μm. In this case, the plurality of magnesium silicate crystals 21 have a minimum particle size of about 0.4 to 0.5 μm. The plurality of rare earth silicate crystals 22 have a minimum particle size of about 0.2 to 0.3 μm.

With respect to the rare earth silicate crystals 22 which contain at least one of erbium silicate crystals and yttrium silicate crystals, respective minimum particle sizes of which are smaller than that of the magnesium silicate crystals 21, an erbium silicate material to be added as a sintering aid may be pulverized in advance so as to be finer than the silicon nitride material. An example of a method for producing the ceramic substrate 3 including the above-mentioned particle size control will be described below.

First, raw material powders of silicon nitride, silica, magnesium oxide, erbium oxide, yttrium oxide, and the like, an organic solvent, and a binder are pulverized using pulverizing means such as a mill, to prepare a raw material powder. In this instance, the raw material powder is mixed until the individual materials have their respective preferred particle sizes, to prepare a slurry.

Then, the prepared slurry is shaped into a sheet form by a method such as a doctor blade method, to prepare a ceramic green sheet in a strip form. The prepared ceramic green sheet is cut into an appropriate size and shape to prepare a plurality of sheets. Then, these sheets are printed with a metalizing ink, and then the resultant sheets are laminated on one another, followed by a firing process at a temperature of about 1400 to 1900° C. A ceramic substrate 3 can be produced through the above-mentioned steps.

As mentioned above, an electronic device 30 comprises the ceramic substrate 3 having any of the above-mentioned configurations and the electronic component 4 thermally connected to the ceramic substrate 3. The electronic component 4 can be mounted on and fixed to the ceramic substrate 3 through the bonding material or the like as mentioned above. Further, the electronic component 4 can be electrically connected to an external electric circuit through the lead terminal 6 or the like.

For example, the ceramic substrate 3 having mounted thereon the electronic component 4, and the lead terminal 6 or lead frame 6A electrically connected to the electronic component 4 through the bonding wire 7 are set in a mold for resin molding, and the mold is filled with an uncured resin material for molding resin, such as an epoxy resin. Then, the uncured resin material is cured by heating. The electronic device 30 can be produced through the above-mentioned steps. The electronic device 30 having the electronic component 4 mounted on the ceramic substrate 3 is, for example, connected to the heat dissipator 5 such as a heat dissipating fin, so that heat is dissipated to the outside. The heat dissipator 5 and the electronic device 30 can be connected to each other through an adhesive such as a resin material. A protruding portion (not shown) maybe disposed on the lower surface of the ceramic substrate 3 so that an anchoring effect obtained due to the protruding portion increases the bonding strength between the electronic device 30 and the heat dissipator 5.

The invention is not limited to the above-described embodiments, and various modifications and variations are possible within the scope of the invention. For example, an exposed metallic portion such as a lead may be covered with a plating layer of nickel, gold or the like.

Further, the ceramic substrate 3 may be disposed on the upper surface side of the electronic component 4 so that the ceramic substrate 3 and the electronic component 4 are thermally connected to each other to enhance an effect of dissipating heat from the electronic component 4 to the outside. In this case, a portion between the upper and lower ceramic substrates 3 may be filled with a molding resin (not shown) so as not to cause a gap (or a space having a smaller thermal conductivity) between the upper and lower ceramic substrates 3.

The grain boundaries 12 between the silicon nitride crystals 11 contained in the ceramic substrate 3 are not necessarily a portion in which the silicate phase 2 is present, and may contain a portion which is present as an air gap. Further, an auxiliary component (glass component or the like) other than the silicate phase 2 may be positioned in the grain boundaries 12.

REFERENCE SIGNS LIST

1: Silicon nitride crystal phase
11: Silicon nitride crystal
12: Grain boundary
2: Silicate phase
21: Magnesium silicate crystal
21a: Magnesium silicate crystal having minimum particle size
22: Rare earth silicate crystal 22a: Rare earth silicate crystal having minimum particle size
3: Ceramic substrate
4: Electronic component
5: Heat dissipator
6: Lead terminal
6A: Lead terminal (Lead frame)
7: Bonding wire
8: Molding resin
30: Electronic device

What is claimed is:

1. A ceramic substrate, comprising:
    a silicon nitride crystal phase containing a plurality of silicon nitride crystals, and grain boundaries between the silicon nitride crystals; and
    a silicate phase containing magnesium silicate crystals and rare earth silicate crystals, respective maximum particle sizes of the magnesium silicate crystals and the rare earth silicate crystals being smaller than that of the silicon nitride crystals, the silicate phase being positioned in the grain boundaries,
    wherein the rare earth silicate crystals contain at least one of erbium silicate crystals and yttrium silicate crystals and the at least one of erbium silicate crystals and yttrium silicate crystals have minimum particle sizes that are smaller than that of the magnesium silicate crystals.

2. The ceramic substrate according to claim 1, wherein a content of the silicate phase in the ceramic substrate is 3 to 20% by mass.

3. The ceramic substrate according to claim 1, wherein a content of the magnesium silicate crystals in the silicate phase is 20 to 90% by mass.

4. The ceramic substrate according to claim 2, wherein a content of the magnesium silicate crystals in the silicate phase is 20 to 90% by mass.

5. The ceramic substrate according to claim 1, wherein the magnesium silicate crystals and the rare earth silicate crystals are positioned in mutually different portions of the grain boundaries.

6. An electronic device, comprising:
    a ceramic substrate, comprising
    a silicon nitride crystal phase containing a plurality of silicon nitride crystals, and grain boundaries between the silicon nitride crystals, and
    a silicate phase containing magnesium silicate crystals and rare earth silicate crystals, respective maximum particle sizes of the magnesium silicate crystals and the rare earth silicate crystals being smaller than that of the silicon nitride crystals, the silicate phase being positioned in the grain boundaries; and
    an electronic component thermally connected to the ceramic substrate,
    wherein the rare earth silicate crystals contain at least one of erbium silicate crystals and yttrium silicate crystals and the at least one of erbium silicate crystals and yttrium silicate crystals have minimum particle sizes that are smaller than that of the magnesium silicate crystals.

* * * * *